United States Patent [19]

McCool et al.

[11] 4,238,746

[45] Dec. 9, 1980

[54] ADAPTIVE LINE ENHANCER

[75] Inventors: John M. McCool, El Cajon; Bernard Widrow, Stanford; James R. Zeidler; Robert H. Hearn, both of San Diego; Douglas M. Chabries, Vista, all of Calif.

[73] Assignee: The United States of America as represented by the Secretary of the Navy, Washington, D.C.

[21] Appl. No.: 888,266

[22] Filed: Mar. 20, 1978

[51] Int. Cl.³ .................... G11C 27/00; H03H 15/02; H03H 7/01

[52] U.S. Cl. .................. 333/166; 307/221 D; 333/165; 333/174

[58] Field of Search ............... 333/17 R, 17 L, 70 R, 333/70 T, 28 R, 18, 29, 165, 166, 138–139, 174; 364/824, 862, 825, 819; 307/221 R, 221 C, 221 D

[56] References Cited

U.S. PATENT DOCUMENTS

| | | | |
|---|---|---|---|
| 3,732,410 | 5/1973 | Mackechnie | 364/824 X |
| 4,064,397 | 12/1977 | Sakaki et al. | 333/28 R X |
| 4,100,513 | 7/1978 | Weckler | 307/221 C X |

OTHER PUBLICATIONS

Widrow et al.—Adaptive Noise Cancelling; Principles and Applications, "In Proc. of the IEEE, vol. 63, No. 12, Dec. 1975;" Title Page & pp. 1692–1716.

*Primary Examiner*—Marvin L. Nussbaum
*Attorney, Agent, or Firm*—Richard S. Sciascia; Ervin F. Johnston; John Stan

[57] ABSTRACT

An input signal X(j) is fed directly to the positive port of a summing function and is simultaneously fed through a parallel channel in which it is delayed, and passed through an adaptive linear transversal filter, the output being then subtracted from the instantaneous input signal X(j). The difference, X(j)-Y(j), between these two signals is the error signal $\epsilon(j)$. $\epsilon(j)$ is multiplied by a gain $\mu$ and fed back to the adaptive filter to readjust the weights of the filter. The weights of the filter are readjusted until $\epsilon(j)$ is minimized according to the recursive algorithm:

$$\vec{W}_{(j+1)} = \vec{W}_{(j)} - \mu\Delta\vec{\epsilon}_j^{-2} \vec{W}_{(j)} + 2\mu\epsilon(j)\vec{X}(j),$$

where the arrow above a term indicates that the term is a signal vector. Thus, when the means square error is minimized, $W_{(j+1)} = W_{(j)}$, and the filter is stabilized.

3 Claims, 3 Drawing Figures

NOTE: $W_i$ INDICATES THE VALUE OF THE WEIGHT AT THE $i^{th}$ TAP

A 3—WEIGHT ADAPTIVE LINE ENHANCER.

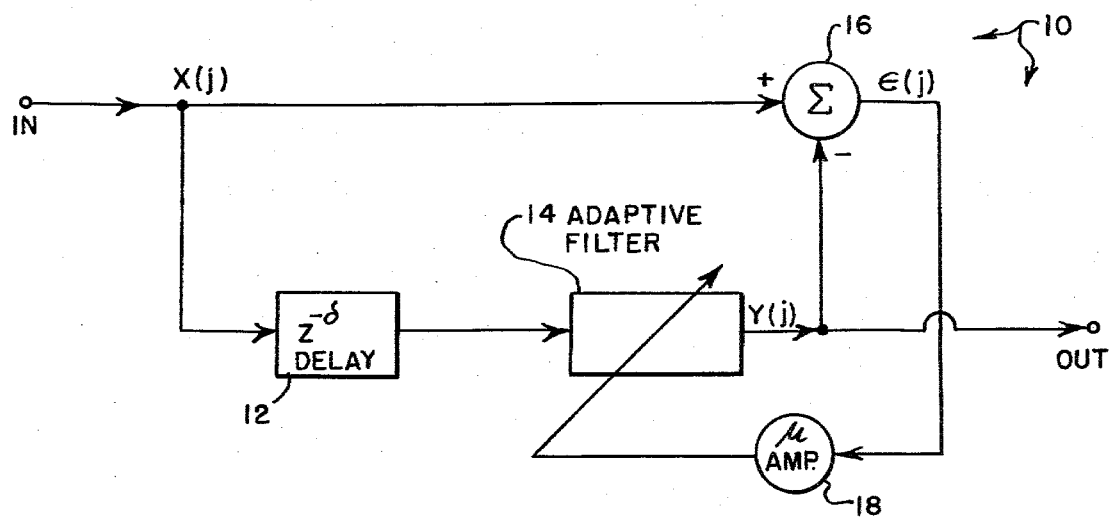
FIG. 1. THE ADAPTIVE LINE ENHANCER.
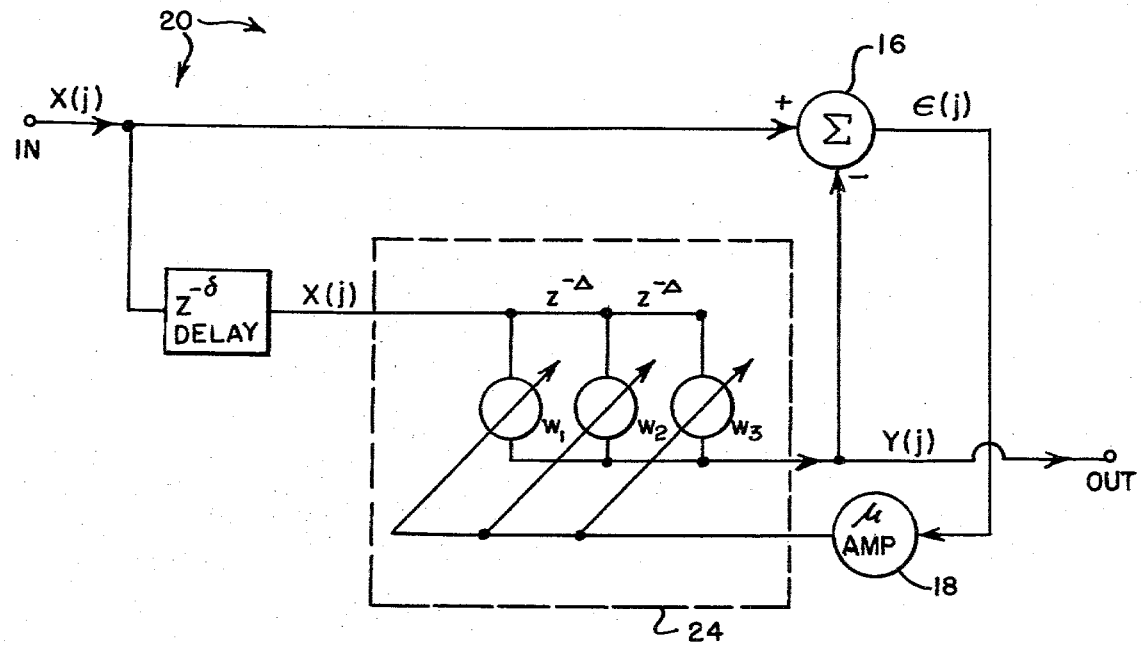
NOTE: $W_i$ INDICATES THE VALUE OF THE WEIGHT AT THE $i^{th}$ TAP.
FIG. 2. A 3-WEIGHT ADAPTIVE LINE ENHANCER.

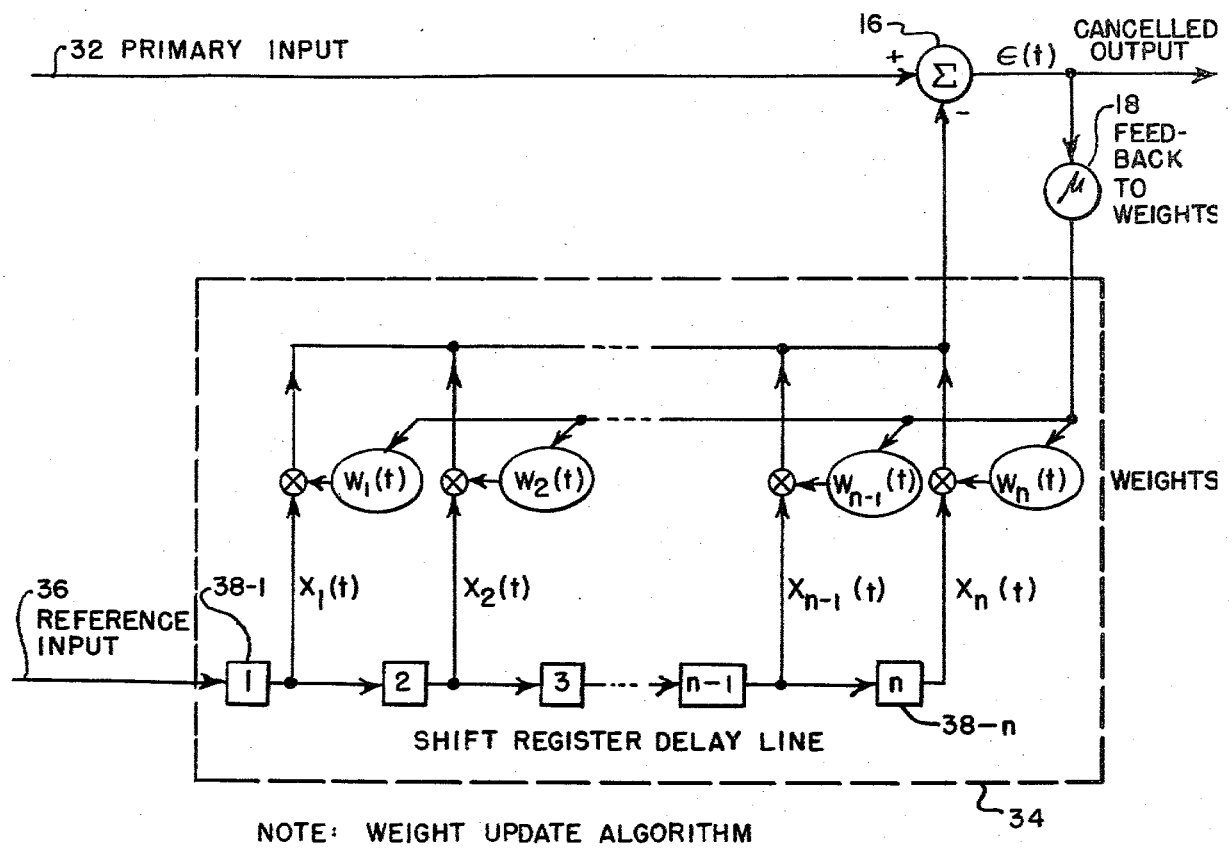
FIG. 3. ADAPTIVE LINE ENHANCER USING SHIFT REGISTERS.

ADAPTIVE LINE ENHANCER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The adaptive line enhancer has significant applications in the enhancement of narrowband spectral lines in a broadband noise field when there is a poor signal-to-noise ratio at the input where there is insufficient a priori information on which to design appropriate filters. The device automatically filters out the components of the signal which are uncorrelated in time and passes the correlated portions. Since the properties of the device are determined solely by the input signal statistics, the properties of the filter automatically adjust to variations in the input signal statistics to obtain the least mean square (LMS) approximation to a Wiener-Hopf filter. The device will thus track slowly varying spectral lines in broadband noise. Specifically, properties are derived of an N-weight adaptive line enhancer for single stable input spectral line in both an arbitrary and a white noise background.

In a discussion of the theory of the invention, an analytic solution is obtained for the LMS weight vector in the signal-to-noise enhancement of an N-weight adaptive line enhancer for a single stable input spectral line in both an arbitrary broadband noise and white noise background. It is shown that the enhancer forms a narrowband filter in which the passband is centered on the frequency of the input spectral line. Also, for stable lines, the signal-to-noise enhancement depends only on the number of weights and is independent of the input signal-to-noise ratio. The enhancer adjusts the phase of the time-delayed input signals so that the components of the two channels, used in the filter, are in phase. The enhancer sets the amplitude of the filter weights so that the total signal and noise power within the passband is equal in the two parallel channels.

Background information useful for understanding this invention appears in the article by Widrow, B. et al, entitled "Adaptive Noise Cancelling: Principles and Applications", which appeared in the December 1975 issue of Proc. of the IEEE, Vol. 63, No. 12, Pp. 1692–1719.

SUMMARY OF THE INVENTION

An adaptive filter for spectral line enhancing comprises a delay line for delaying an input signal $X(j)$ by a fixed time delay $-\delta$. A transversal filter, whose input is connected to the output of the delay line, filters the delayed signal, the output of the filter comprising a signal $Y(j)$. A summer, having its inputs to signals $X(j)$ and $Y(j)$ subtracts the signal $Y(j)$ from $X(j)$, the output of the summing means being the error signal $\epsilon(j)$. A multiplier having a gain of $\mu$ multiplies the input signal $\epsilon(j)$ by a gain of $\mu$, the output of the multiplier being fed back to the filter, to cause the weights to be readjusted.

OBJECTS OF THE INVENTION

An object of the invention is to provide an adaptive filter which is capable of spectral line enhancing.

Another object of the invention is to provide an adaptive filter which can enhance narrowband spectral lines in a broadband noise field.

Yet another object of the invention is to provide an adaptive filter which can filter out the components of an input signal which are uncorrelated in time and pass the correlated portions.

Still another object of the invention is to provide an adaptive filter of the transversal type where it is not necessary to know in advance the tap weights.

These and other objects of the invention will become more readily apparent from the ensuing specification when taken together with the drawings.

BRIEF DESCRIPTION OF THE DRAWINGS

FIG. 1 is a block diagram of the basic adaptive line enhancer (ALE).

FIG. 2 is a block diagram of a three-weight adaptive line enhancer.

FIG. 3 is a block diagram of an adaptive line enhancer using shift registers.

DESCRIPTION OF THE PREFERRED EMBODIMENT

Referring now to the FIG. 1, therein is shown an adaptive line enhancer 10 for spectral line enhancing, comprising a means 12 for delaying an input signal $X(j)$ by a fixed time delay $\delta$. A weighted means 14, whose input is connected to the output of the delaying means 12, adaptively filters the delayed signal, the output of the filtering means comprising a signal $Y(j)$. A means for performing the least means square (LMS) algorithm is implicitly included in the adaptive filter 14, although not explicitly shown in FIG. 1. The relationship of the LMS means to the adaptive filter is, however, clearly shown in the above mentioned reference by Widrow et al in his FIG. 29, on page 1709.

Means, having as inputs the signals $X(j)$ and $Y(j)$, subtract the signal $Y(j)$ from $X(j)$, the output of the subtracting means being the error signal $\epsilon(j)$. What is herein termed a subtracting means 16 is often referred to as a summing means.

Means 18, having as an input the signal $\epsilon(j)$, multiply the signal by a gain $\mu$, the output of the multiplying means being fed back to the filtering means 14, thereby causing the weights of the filter to be readjusted. Generally, in the adaptive line enhancer 10, the weighted filtering means 14 would comprise a transversal filter. In an embodiment actually built, the transversal filter 14 was a digital filter. In one embodiment of the adaptive line enhancer 10, the digital filter comprised shift registers, whereas in another embodiment the digital filter comprised random-access memories.

Discussing now the theory with respect to the invention, the adaptive line enhancer (ALE) is a new device that involves alternating the inputs and outputs of an adapted least-means-square (LMS) linear transversal filter. These filters are described by B. Widrow, "Adaptive Filters," in *Aspects of Network and System Theory*, R. E. Kalman and N. Declaris, eds., Holt, Rhinehart & Winston, Inc., New York, 1971; and by the same author in the Stanford Electronics Laboratory Technical Report No. 6764-6, Stanford University, 1966. The applications to the measurement of narrowband spectral lines in a broadband noise field are significant in cases of poor signal-to-noise ratio when insufficient a priori information is available to design appropriate filters. The enhancer automatically filters out the components of the input signal which are uncorrelated in time and passes the correlated portions. When the input waveform consists of a set of non-interacting narrowband signals superimposed on a white noise input signal, the enhancer constructs a set of narrowband filters whose passbands are centered about each of the narrowband input signals.

The device thus approximates a set of matched filters in which the filter passbands are determined automatically, solely on the basis of the input signal statistics. No predetermined information as to the number of signals, their frequencies, or the dynamics of their source is required. For stable spectral lines, there is no threshold signal-to-noise ratio required to ensure effective operation of the device and the signal-to-noise enhancement is achieved independently of the input signal-to-noise ratio.

As is also shown in the reference cited hereinabove, since the enhancer is an adaptive filter, the device automatically adjusts the passband of the filter to follow changes in the input signal's statistics. The enhancer is thus capable of tracking slowly varying spectral lines in broadband noise. The frequency limitations of the device are determined by the input sampling rate, the number of weights, and the weight update rate. The time required to update each weight using current hardware is approximately 500 nsec per weight, and each weight is updated at the input sampling rate.

The above mentioned properties of the enhancer have been verified experimentally and by computer simulations. The signal-to-noise enhancement of the device is achieved by measuring correlations between the signal and the noise components of the input waveform. Since the signal is correlated in time and the noise is uncorrelated, the process and gain of the device can be increased for stable lines by increasing the number of filter weights.

Since the enhancer is a variation of the least-means-square adaptive filter, the basic criteria regarding the convergence stability of the filter are identical to those derived in the reference cited hereinabove. The theory to be discussed will derive the LMS weight factor and the gain and signal-to-noise ratio for an N-weight enhancer for an input signal consisting of a single stable spectral line in an arbitrary noise background. These results will be used to derive specific solutions for a white noise input. The solutions illustrate the fundamental properties of the enhancer and provide a basis for extended analysis to include the properties of the enhancer for input signals which consist of multiple spectral lines and/or time-varying or short-duration input spectral lines.

Referring back to FIG. 1, therein is shown an enhancer 10 for real input signals. The input signal X(j) is fed directly to the positive port of a summing function 16 and is simultaneously fed through a parallel channel in which it is delayed, by delay line 12, passed through an adaptive linear transversal filter 14, and then subtracted from the instantaneous signal in summer 16. The difference between these two signals is the error signal $\epsilon(j)$, which is multiplied by a gain $\mu$ and fed back to the adaptive filter 14 to readjust the weights. The weights of the filter 14 are readjusted until $\epsilon(j)$ is minimized according to the recursive algorithm (1), which is described in the reference cited hereinabove.

$$\vec{W}(j+1) = \vec{W}(j) - \mu \Delta \epsilon_j{}^{-2} \vec{W}(j) + 2\mu\epsilon(j)\vec{X}(j) \qquad (1)$$

Thus, when the means square error is minimized, $W(j+1)=W(j)$, and the filter is stabilized. The algorithm results in a convergent solution for a wide range of practical conditions. This algorithm is obtained by using a method of steepest descent to minimize the mean square error as discussed in the reference cited. It is shown that for steady-state input statistics, as the integration time becomes long, the weight vector that minimizes the means square error is equivalent to the Wiener-Hopf solution, i.e., $$\vec{W_{LMS}} = \Phi^{-1}(X',X)\overrightarrow{\Phi(X'X)}, \qquad (2)$$

where $\vec{X'}$ is the sampled, time-delayed signal vector, and $\vec{X}$ is the instantaneous signal at the positive port of the summing function. $\overrightarrow{\Phi(X',X')}$ is the autocorrelation matrix of the sampled, time-delayed signal, and $\overrightarrow{\Phi(X',X)}$ is the crosscorrelation vector between $\vec{X'}$ and $\vec{X}$.

It has been shown, in the cited reference, that Eq. (1) is equivalent to Eq. (2) within the misadjustment noise of the filter.

It has been shown that Eq. (1) is equivalent to Eq. (2) within the misadjustment noise of the filter. Misadjustment noise is the difference between the actual solution of the Widrow-Hopf and the Wiener-Hopf solution, that is, the difference between an ideal linear transversal filter and a Wiener filter. The misadjustment noise is present because of the error that arises in estimating the gradient of the error surface in Eq. (1). The recursive implementation of Eq. (1) thus allows an approximate Wiener-Hopf solution to be obtained in real time and circumvents the difficulty of calculating $\Phi^{-1}(X',X')$ explicitly.

The magnitude of the misadjustment noise decreases as $\mu$ decreases. A good approximation to Eq. (2) can be obtained by the recursive implementation of Eq. (1) by proper adjustment of the feedback gain parameter. As $\mu$ decreases, the time constant of the filter increases and a fundamental limit arises for time-varying spectral lines. For stable input signals, the filter misadjustment noise can always be made negligible by reducing the value of $\mu$.

To illustrate the essential features of the enhancer, the properties of a 3-weight and a 4-weight will be discussed. These cases can easily be treated analytically since $\Phi^{-1}(X',X')$ can readily be derived. For a single complex spectral line in broadband noise, it is possible to obtain an explicit expression for $\Phi^{-1}(X',X')$ for an N-weight filter by decomposing the matrix into a vector product. It will be shown that the results obtained for real and complex input signals are equivalent and the filter gain and the LMS weight vector will be derived for an N-weight filter for a single spectral line in white noise.

Consider the 3-weight filter shown in FIG. 2 with $\omega_0\delta=\pi/2$ and $\omega_0\Delta=2\pi/3$. If $$X(j) = A \sin \omega_0 j + x_{n0}(j) \qquad (3)$$

$$X_1'(j) = A \cos \omega_0 j + x_{n1}(j) \qquad (4)$$

$$X_2'(j) = A \sin (\omega_0 j + 30°) + x_{n2}(j) \qquad (5)$$

$$X_3'(j) = A \sin (\omega_0 j - 30°) + x_{n3}(j), \qquad (6)$$

where A is the maximum amplitude of the spectral line and $x_i'(j)$ is the time-delayed signal at the $i^{th}$ tap at the $j^{th}$ input sample time. $x_{ni}(j)$ is the broadband noise component of the input signal at the $i^{th}$ tap, and $x_{n0}(j)$ is the instantaneous noise signal at the $j^{th}$ iteration. If the time delays $\delta$ and $\Delta$ are sufficient to decorrelate the noise in the two channels, for a white noise field, $$\lim_{T \to \infty} \frac{1}{2T} \int_{-T}^{T} x_{n0} x_{ni} dt = 0 \qquad (7)$$

The input signal correlation matrix is thus given by $$\Phi(X',X') = \sigma_s^2 \begin{pmatrix} (1+C) & -\frac{1}{2} & -\frac{1}{2} \\ -\frac{1}{2} & (1+C) & -\frac{1}{2} \\ -\frac{1}{2} & -\frac{1}{2} & (1+C) \end{pmatrix} \qquad (8)$$

where $$\sigma_s^2 = A^2/2, \qquad (9)$$

and $$C = \sigma_n^2/\tau_s^2. \qquad (10)$$

$\sigma_s^2$ and $\sigma_n^2$ are the time-averaged signal and noise power per unit bandwidth, respectively.

The crosscorrelation vector between the signals in the two parallel channels is given by $$\Phi(\vec{X},\vec{X'}) = \frac{\sqrt{3}}{2} \sigma_s^2 \begin{pmatrix} 0 \\ -1 \\ 1 \end{pmatrix} \qquad (11)$$

thus, from Eqs. (2), (8), and (11), $$\vec{W}_{LMS} = \frac{\sqrt{3/2}}{(3/2)+C} \begin{pmatrix} 0 \\ -1 \\ 1 \end{pmatrix} = [(3/2)\sigma_s^2 + \sigma_n^2]^{-1} \Phi(\vec{X},\vec{X'}) \qquad (12)$$

The steady-state output of the enhancer is given by $$Y(j) = \vec{W}_{LMS} \cdot \vec{X'(j)} \qquad (13)$$

and $$Y(j) = 1 + \left(\frac{2\sigma_n^2}{3\sigma_s^2}\right)^{-1} \left[ A \sin \omega_0 j + \frac{1}{\sqrt{3}} (x_{n3}(j) - x_{n2}(j)) \right] \qquad (14)$$

The enhancer thus adjusts the weights so that the narrowband signal component of $Y(j)$ is in phase with $X(j)$. The gain in signal-to-noise power is given by $$G = [S/N)_{y(j)}/S/N)_{x(j)}], \qquad (15)$$

where $(S/N)_{y(j)}$ is the ratio of the signal power to the noise power in the output waveform, and $(S/N)_{x(j)}$ is the signal-to-noise ratio in the input waveform.

$$(S/N)_{x(j)} = \overline{[Y^2(j)]}_S / \overline{[Y^2(j)]}_N, \qquad (16)$$

where $\overline{[Y^2(j)]}_S$ and $\overline{[Y^2(j)]}_N$ are the time-averaged signal and noise power components of $Y^2(j)$. From Eq. (14), $$(S/N)_{Y(j)} = \sigma_s^2 / 1/3 (\sigma_{n3}^2 + \sigma_{n2}^2). \qquad (17)$$

For white noise, $$\overline{\sigma_n^2} = \overline{\sigma_{n0}^2} = \overline{\sigma_{n1}^2} = \overline{\sigma_{n2}^2} = \overline{\sigma_{n3}^2} \qquad (18)$$

where the bar indicates a time average, and $$(S/N)_{Y(j)} = 3/2 \sigma_s^2 / \sigma_n^2. \qquad (19)$$

Therefore, $$G = 3/2. \qquad (20)$$

A variation in the time delay between taps for a given input signal varies the sampling rate and changes the magnitude of the elements of the signal correlation matrix. The gain in the signal-to-noise ratio of the filter thus depends on the details of the sampling process. The filter gain, the LMS weight vector, and the crosscorrelation vector are tabulated for various time delays and sampling rates in Table 1. The dependence of the filter gain on the sampling rate arises because the sampled waveform is not an accurate representation of the input waveform. As the number of weights increases and the sampled waveform becomes an accurate representation of the input waveform, the gain of the filter approaches a value that is determined by the average value of the input waveform and is independent of the details of the sampling process. This will be shown in the next section for an N-weight filter for a single spectral line. The sampling rate should be asynchronous with the frequency of the input signal to ensure that the sampled waveform is approximately equal to the input waveform.

TABLE 1

Properties of 3- and 4-Weight Adaptive Line Enhancers

| N | $\omega_0\delta$ | $\omega_0\Delta$ | G | $W_{LMS}$ | $\Phi(X,X')$ |
|---|---|---|---|---|---|
| 3 | 90° | 120° | 3/2 | $\frac{\sqrt{3}}{3+2C}\begin{pmatrix}0\\-1\\0\end{pmatrix}$ | $\frac{\sqrt{3}}{2}\sigma_s^2\begin{pmatrix}0\\-1\\1\end{pmatrix}$ |
| 3 | 60° | 60° | 2 | $(2+C)^{-1}\begin{pmatrix}-\sqrt{3/2}\\\frac{1}{2}\\1\end{pmatrix}$ | $\sigma_s^2\begin{pmatrix}-\sqrt{3/2}\\\frac{1}{2}\\1\end{pmatrix}$ |
| 3 | 90° | 90° | 1 | $(1+C)^{-1}\begin{pmatrix}0\\-1\\0\end{pmatrix}$ | $\sigma_s^2\begin{pmatrix}0\\-1\\0\end{pmatrix}$ |
| 4 | 90° | 90° | 2 | $(2+C)^{-1}\begin{pmatrix}0\\-1\\0\\1\end{pmatrix}$ | $\sigma_s^2\begin{pmatrix}0\\-1\\0\\1\end{pmatrix}$ |

Although the gain is different in each of the examples in Table 1, it will be noted that in each case $$\vec{W}_{LMS} = [G \sigma_s^2 + \sigma_n^2]^{-1} \vec{\Phi(x,x')} \qquad (21)$$

Thus if the input signal is given by Eq. (3), and Eq. (7) is satisfied, the crosscorrelation vector is given by $$\Phi(X,X') = \sigma_s^2 \begin{pmatrix} \cos\omega_0\delta \\ \cos\omega_0(\delta+\Delta) \\ \vdots \\ \cos\omega_0[\delta+(N-1)\Delta] \end{pmatrix} \quad (22)$$

If the input signal is a complex waveform consisting of a single narrowband component, it is possible to decompose the autocorrelation matrix into a vector product and derive the filter gain and the LMS weight vector for an N-weight filter. If there is no correlation between the narrowband signal component and the noise component of the input waveform, the autocorrelation matrix can be separated into two matrices, one expressing the noise correlations between taps and the second expressing the narrowband signal correlations. Thus for an N-weight filter, $$\Phi(X',X') = P(X_s',X_s') + Q(X_n',X_n'), \quad (23)$$

where P is the narrowband signal correlation matrix, and Q is the noise correlation matrix. For an N-weight filter, $$P(X_s',X_s') = \begin{bmatrix} p_{11}p_{12}\cdots p_{1n} \\ \vdots \\ p_{1n}p_{2n}\cdots p_{nn} \end{bmatrix} \quad (24)$$

where $$p_{ik} = \frac{1}{\sigma_s^2} \lim_{T\to\infty} \frac{1}{2T} \int_{-T}^{T} x_{si}'^*(j) x_{sk}'(j) dt, \quad (25)$$

and where the asterisk (*) indicates complex conjugation.

Likewise, $$Q = \begin{bmatrix} q_{11}q_{12}\cdots q_{1k} \\ \vdots \\ q_{n1}q_{n2}\cdots q_{nk} \end{bmatrix} \quad (26)$$

where $$q_{ik} = \frac{1}{\sigma_s^2} \lim_{T\to\infty} \frac{1}{2T} \int_{-T}^{T} x_{ni}'^*(j) x_{nk}'(j) dt. \quad (27)$$

For a single complex spectral line, $$[x_s'(j)]_i = A \exp[j\omega_0(t+\delta+i\Delta)], \quad (28)$$

where $$i = 0, 1, \ldots, (n-1).$$

Therefore, $$p_{ik} = \exp[j\omega_0\Delta(i-k)]. \quad (29)$$

For a single complex spectral line, it is thus possible to define a delay vector, D, and decompose the P matrix into a vector product. From Eq. (29), if $$D = e^{j\omega\delta}\begin{pmatrix} 1 \\ e^{2j\omega 0\Delta} \\ \vdots \\ e^{(n-1)j\omega 0\Delta} \end{pmatrix} \quad (30)$$

$$P = DD^{*T}, \quad (31)$$

that is, the product of the delay vector D and its conjugate transpose $D^{*T}$. Eq. (2) thus reduces to $$W_{LMS} = \sigma_n^2 Q + \sigma_s^2 D\, D^{*T-1}\sigma_s^2 \to D \quad (32)$$

For an arbitrary square matrix A and arbitrary column vectors U and V, it can be shown that $$(A+UV^{T-1}) = A^{-1} - \{(A^{-1}U)(V^T A^{-1})/(1+V^T A^{-1}U)\} \quad (33)$$

The derivation is shown by D. J. Edlblute, J. N. Fisk, G. L. Kinnson, *J. Acoust. Soc. An.*, 41, 199(1967).

Using this identity, Eq. (32) reduces to $$W_{LMS} = (\sigma_s^2 Q^{-1} D/\sigma_n^2)\{1 - (\sigma_s^2/\sigma_n^2)\{D^{*T}Q^{-1}D/[1+(\sigma_s^2 D^{*T}Q^{-1}D/\sigma_n^2)]\}\} \quad (34)$$

Equation (34) can be reexpressed in terms of the filter again. When the signal and noise waveforms are uncorrelated, it can readily be shown that the gain of the filter is identical to that previously derived for an N-element detector array. Eq. (15) thus reduces to $$G = \vec{W}_{LMS}^{*T} P \vec{W}_{LMS} \vec{W}_{LMS}^{*T} Q \vec{W}_{LMS}, \quad (35)$$

As indicated by Eq. (1), a stable solution for the weight vector of the ALE is obtained by minimizing the output power at the summing junction. It has been shown that for a Wiener processor analogous to the ALE, the minimization of the output power is equivalent to maximizing the gain of the array. By differentiating Eq. (35) and solving the corresponding eigenvalue equation, it has been shown in the Edelblute reference that $$G = D^{*T}Q^{-1}D. \quad (36)$$

Eq. (36) therefore reduces to $$\vec{W_{LMS}} = W_0 Q^{-1}\vec{D} \quad (37)$$

where $$W_0 = \sigma_s^2/(G\sigma_s^2 + \sigma_n^2). \quad (38)$$

Equations (36) and (37) give the LMS weight vector and the filter gain for an arbitrary broadband noise background. For white noise, $$Q^{-1} = I, \quad (39)$$

where I is the identity matrix. Thus Eq. (37) reduces to $$G = N^* = N/2. \quad (40)$$

N* is the number of complex weights and N is the total number of weights. Two linear delay lines are required to process the complex input signal expressed by Eq. (38) since the real and imaginary components must be processed independently. A complex weight thus consists of two taps—one on each delay line. This is elaborated upon by B. Widrow, J. McCool, M. Ball, "The Complex LMS Algorithm," *Proc. IEEE* April 1975, pp. 719-20. Thus for a white noise input, $$\vec{W_{LMS}} + W_0 \vec{D}. \tag{41}$$

For a real input signal $$X(j) = A \cos \omega_0 j + x_n(j), \tag{42}$$

and $$P = Re(DD^{*T}). \tag{43}$$

Thus $$p_{ik} = \cos[(i-k)\omega_0 \Delta]. \tag{44}$$

In this case, the P matrix is no longer separable into a vector product, but if the interference between positive and negative frequencies is negligible (i.e., when $\omega_0 >> 1/N$)$W_{LMS}$ is given by the real part of Eq. (41). Therefore, for a real input signal, $$\vec{W_{LMS}} = W_0 Re(Q^{-1}\vec{D}). \tag{45}$$

For white noise, Eq. (45) reduces to, $$W_{LMS} = W_0 \begin{pmatrix} \cos \omega_0 \delta \\ \cos \omega_0(\delta + \Delta) \\ \vdots \\ \cos \omega_0[\delta + (N-1)\Delta] \end{pmatrix} \tag{46}$$

It will be noted that Eq. (21) and Eq. (46) are in agreement. Since the filter gain is a scalar, G cannot be determined from Eq. (36) for real input signals. However, it can be shown that by evaluating Eq. (35), the filter gain also equals N/2 for a real input signal. The gain of the real and imaginary components of a complex enhancer are thus equal.

The output of the ALE can be determined in terms of Eqs. (13) and (46). If $$X(j) = A \cos \omega_0 j + x_n(j), \tag{47}$$

the filter output is given by $$Y(j) = W_0 \left\{ \sum_{i=0}^{N-1} A \cos\omega_0(\delta + i\Delta) \cos \omega_0[j - (\delta + i\Delta)] \right. \tag{48}$$

$$\left. + \sum_{i=0}^{N-1} \cos \omega_0(\delta + i\Delta) x_n(j) \right\}$$

Thus, the narrowband spectral components of Y(j) and X(j) are in phase when $$\sum_{i=0}^{N-1} \sin \omega_0(\delta + i\Delta) \cos \omega_0(\delta + i\Delta) = 0. \tag{49}$$

This identity is satisfied in the four cases listed in Table 1, but it not true for arbitrary values of $\delta$ and $\Delta$. In the asymptotic limit as N becomes large, the summations in Eq. (48) can be evaluated in terms of the average values of the waveforms. As N becomes large, $$\sum_{i=0}^{N-1} \cos^2\omega_0(\delta + i\Delta) \approx \frac{N}{2T} \int_{-T}^{T} \cos^2\omega_0 t' dt' = N/2, \tag{50}$$

and $$\sum_{i=0}^{N-1} \sin\omega_0(\delta + i\Delta)\cos\omega_0(\delta + i\Delta) \approx N/4T \int_{T}^{T} \sin2\omega_0 t' dt' = 0. \tag{51}$$

Therefore, $$Y(j) \approx W_0 \left\{ (AN/2)\cos\omega_0 j + \sum_{i=0}^{N} \cos\omega_0(\delta + i\Delta)x_n(j) \right\}. \tag{52}$$

For a white noise input, the frequency spectrum of the output is thus equal to $$Y(\omega) = W_0 \{2\pi NA[\delta(\omega - \omega_0) + \delta(\omega + \omega_0)] \tag{53}$$
$$+ k(\omega)(N\Delta/2) [\text{sinc}(\omega + \omega_0)N\Delta/2 + \text{sinc}(\omega - \omega_0)N\Delta/2]\}$$

where $k(\omega)$ is the time-averaged noise power per unit bandwidth. The filter output can be determined by transforming Eq. (53). As $N\Delta$ increases, the ALE becomes a narrowband filter, and the narrowband-filtered noise term is given by $$n(j) = r_n(j) \cos [\omega_0 j + \phi_n(j)] \tag{54}$$

where $$r_n^2 = n_c^2 + n_s^2 \text{ and } \phi_n = \tan^{-1}(n_s/n_c). \tag{55}$$

This is derived by A. B. Carlson, *Communication Systems*, McGraw-Hill, New York, 1968.

The terms $n_c$ and $n_s$ are determined from a summation over the filter bandwidth, B. If the filter bandwidth is divided into M bands, where $B = M\Delta f$, $$n_c(j) = \sum_{m=-M/2}^{M/2} A_m \cos (2\pi m\Delta ft + \theta_m) \tag{56}$$

and $$n_s(j) = \sum_{m=-M/2}^{M/2} A_m \sin (2\pi m\Delta ft + \theta_m). \tag{57}$$

Equation (53) shows that the filter formed by the enhancer is a narrowband filter centered at $\omega_0$, and the narrowband component of the filter output in Eq. (53) is in phase with the input spectral line. The filtered noise term has a random phase factor as indicated in Eqs. (54)–(57), but represents an additional narrowband signal superimposed on the spectral line, which increases the recognition differential of the spectral line. The presence of the filtered noise term accounts for the noise power term in the amplitude factor $W_0$ in Eq. (38).

In summary, it has been shown that as long as the time delay is sufficient to decorrelate the noise between the two channels of the enhancer the basic structure of the LMS weight vector (i.e., the relative magnitude of the individual weights) is independent of the noise power and is determined solely by the spectral components of X(j). The noise power affects $W_{LMS}$ only in terms of the amplitude normalization factor, $W_0$, as indicated by Eq. (38).

With respect to the filter output and frequency response of the filter, it has been shown that the filter adjusts the phase of the time-delayed waveform so that the spectral components of the waveforms in the two channels are in phase at the summing junction. The frequency response of the filter has been shown to be proportional to a sinc function centered at the frequency of the input spectral line. Thus, as the number of weights increases (for a fixed sampling rate), the passband of the filter narrows in frequency and the overall gain of the filter increases. As the number of weights becomes large, the filter gain approaches N/2 as indicated by Eq. (40). The amplitude of the weights is adjusted to minimize $\overline{\epsilon^2(j)}$ as indicated by Eq. (1). Equations (52) and (54) indicate that the filter will attempt to adjust the phase and amplitude of the spectral components of the input waveform so that they cancel at the summing junction. For uncorrelated noise, $\overline{\epsilon^2(j)}$ is minimized by filtering out as much of the noise in Y(j) as possible without attenuating the spectral components. The filter output consists of the input spectral line plus filtered noise centered at the frequency of the spectral line. The amplitude normalization factor, $W_0$, adjusts the gain of the weights until the power of the spectral components at $\omega = \omega_0$ in the two channels are equal. Since the narrowband filtered noise adds to the signal at $\omega = \omega_0$, $W_0$ is proportional to the filter gain and the input signal and noise power. It would be expected that as the signal-to-noise ratio approaches zero, the output power of the filter would approach zero, since in this case $\overline{\epsilon^2(j)}$ would be minimized by filtering out the entire input waveform. This property is evident since $W_0 \to 0$ as $\sigma_n^2 \ G \sigma_s^2 \to \infty$. The significant feature of the enhancer is that, although $W_0 \to 0$ as $\sigma_n^2 \ G \sigma_s^2 \to \infty$, the relative magnitude of the individual weights and, consequently the bandwidth of the filter, is independent of the input signal-to-noise ratio. This fact, coupled with the filter gain achieved by performing correlations between the signal and the time-delayed signal, assures effective operation of the devices for stable input signals even when the input signal power is significantly less than the input noise power.

It has been shown that the enhancer does not increase the magnitude of the transmitted spectral lines. Rather, the filter decreases the magnitude of the output power at frequencies outside the passband of the filter. The filter enhances the spectral lines because of the enhanced recognition differential between adjacent frequency bins inside and outside the passband of the filter. The enhancer functions as a matched filter that is constructed automatically, with no a priori information, on the basis of the input signal characteristics. Although the values of the gain and the frequency response of the filter derived above are valid only when the input waveform consists of a single spectral line in white noise, it is clear that the principles delineated above also apply in the more general case of noninterfering multiple spectral lines in correlated noise. As shown hereinabove, the filter tends to pass the components of the input waveform that are correlated in the two parallel channels of the enhancer and to filter out the uncorrelated portions.

The adaptive line enhancer provides a general method of increasing the detection probability of stable spectral lines in broadband noise. The filter parameters were obtained for an arbitrary noise field and specific results were derived for a white noise spectrum at the input. For stable spectral lines, the effectiveness of the device has been shown to be determined by the number of filter weights, by the autocorrelation functions of the signal and noise components of the input waveform, and by the crosscorrelation between the signal and noise components of the instantaneous waveform and the time-delayed waveform.

Obviously, many modifications and variations of the present invention are possible in the light of the above teachings, and, it is therefore understood that within the scope of the disclosed inventive concept, the invention may be practiced otherwise than specifically described.

What is claimed is:

1. An adaptive line enhancer for spectral line enhancing, generally in an environment where significant noise is present, comprising:

means for delaying an input signal X(j) by a fixed time delay $\delta$;

weighted means, whose input is connected to the output of the delaying means, for adaptively filtering the delayed signal, using a least-means-square (LMS) algorithm, the output of the filtering means comprising a signal Y(j);

means, having as inputs the signals X(j) and Y(j), for subtracting the signal Y(j) from X(j), the output of the subtracting means being the error signals $\epsilon(j)$;

means, having as an input the signal $\epsilon(j)$, for multiplying the signal by a gain $\mu$, the output of the multiplying means being fed back to the filtering means, to cause the weights of the weighted means to be readjusted in a manner to minimize the difference between the signal X(j) and the signal Y(j), thereby minimizing the error signal $\epsilon(j)$, wherein:

the weighted filtering means comprises a transversal filter.

2. The adaptive line enhancer, according to claim 1, wherein:

the transversal filter is a digital filter.

3. The adaptive line enhancer according to claim 2, wherein:

the digital filter comprises shift registers.

* * * * *